United States Patent
Shin (10) Patent No.: US 7,034,590 B2
(45) Date of Patent: Apr. 25, 2006

(54) DELAY LOCKED LOOP CIRCUITS AND METHODS PREVENTING ERRONEOUS TRANSITION FROM COARSE LOCK TO FINE LOCK DUE TO NOISE OR JITTER

(75) Inventor: Sang-Woong Shin, Seongnam-si (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/876,811

(22) Filed: Jun. 24, 2004

(65) Prior Publication Data
US 2005/0007166 A1    Jan. 13, 2005

(30) Foreign Application Priority Data
Jul. 7, 2003    (KR) .................. 10-2003-0045791

(51) Int. Cl.
*H03L 7/06* (2006.01)

(52) U.S. Cl. .................. 327/158; 331/25; 375/376
(58) Field of Classification Search .................. 327/158
See application file for complete search history.

(56) References Cited

U.S. PATENT DOCUMENTS

| | | | |
|---|---|---|---|
| 5,744,991 A * | 4/1998 | Jefferson et al. | 327/158 |
| 6,346,837 B1 * | 2/2002 | Shibayama | 327/156 |
| 6,388,485 B1 * | 5/2002 | Kim | 327/161 |
| 6,518,807 B1 * | 2/2003 | Cho | 327/158 |
| 6,765,976 B1 * | 7/2004 | Oh | 375/376 |

* cited by examiner

*Primary Examiner*—Minh Nguyen
(74) *Attorney, Agent, or Firm*—F. Chau & Associates LLC

(57) ABSTRACT

Delayed locked loop (DLL) circuits and methods using a coarse-fine lock structure which prevent malfunction due to jitter or noise that causes erroneous transitions from a coarse-lock to a fine-lock delay. A phase detector uses two feedback signals to detect a phase of an external clock signal (or reference signal) based on a phase difference between the two feedback signals, thereby enabling a more accurate determination as to when to transition from a coarse-lock to a fine-lock delay. The phase difference of the two feedback signals can be regulated by using frequency information to set a phase difference between the first and second feedback signals to renders the detection process more robust against noise or jitter over a wide frequency band from a low frequency to a high frequency, for determining when to transition from the coarse-lock to the fine-lock.

18 Claims, 5 Drawing Sheets

Lag Behind External Clock
; delay up

Fig. 2B
(Prior Art)

Lead External Clock
; delay down

Fig. 8

DELAY LOCKED LOOP CIRCUITS AND METHODS PREVENTING ERRONEOUS TRANSITION FROM COARSE LOCK TO FINE LOCK DUE TO NOISE OR JITTER

CROSS-REFERENCE TO RELATED APPLICATION

This application claims priority to Korean Patent Application No. 2003-45791, filed on Jul. 7, 2003 in the Korean Intellectual Property Office, which is fully incorporated herein by reference.

TECHNICAL FIELD OF THE INVENTION

The present invention relates to circuits and methods for providing clock synchronization for semiconductor integrated circuit memory devices and, more particularly, to DLL (delay locked loop) circuits and methods using a coarse-lock/fine-lock framework, which prevent erroneous transitions from a coarse-lock to a fine-lock due to jitter or noise.

BACKGROUND

In general, a DLL (delay locked loop) circuit functions to delay a reference clock signal by a preset time period to thereby generate a delayed clock signal which is delayed relative to the reference clock signal. The generation of delayed clock signals is generally necessary in certain circuits which exhibit relatively high integration densities and which are synchronized with external clock signals. Such circuits include DRAM (dynamic random access memory) integrated circuit device.

For example, a semiconductor memory device that operates in synchronization with an external clock signal will receive the external clock signal via an input pin of the integrated circuit device, which is applied to a clock buffer to generate an internal clock signal. The internal clock signal, in turn, controls, e.g., a data output buffer to output data from the integrated circuit memory device. If the internal clock signal is delayed by a predetermined time from the external clock signal, high-frequency operation performance of the memory device is degraded. In particular, the data output time after the external clock signal is applied, i.e., output data access time (tAC), is increased. In other words, due to the delay, the time period needed to output data (output data access time) is increased. Accordingly, a DLL can be implemented in the semiconductor integrated circuit memory device to facilitate synchronization of memory access functions.

Figure 1A:
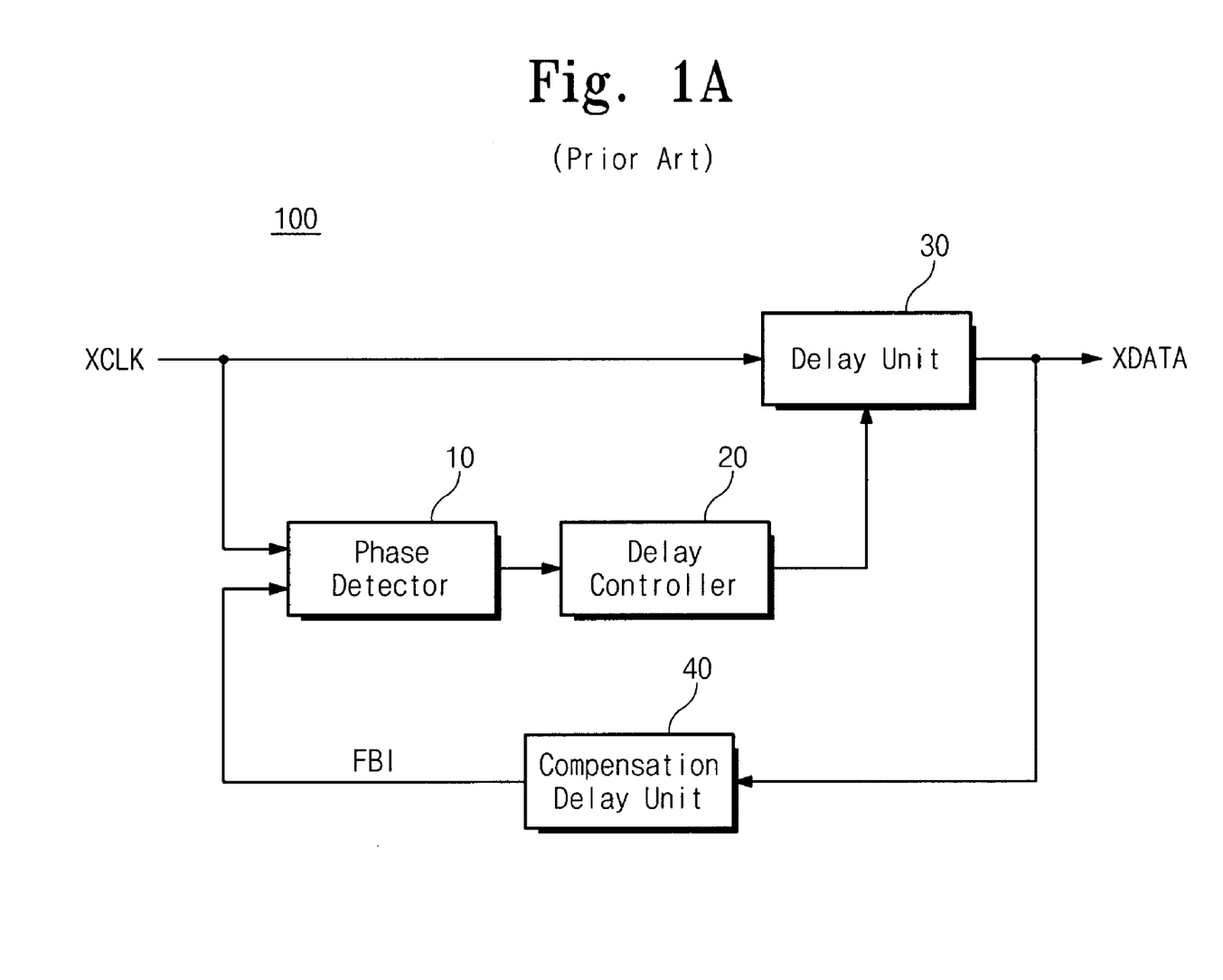
FIG. 1A schematically illustrates a conventional embodiment of a delay locked loop (DLL).

FIG. 1A schematically illustrates a conventional embodiment of a delay locked loop (DLL). The DLL circuit (100) comprises a phase detector (10), delay controller (20), delay unit (30) and compensation delay unit (40). In general, the delay unit (30) delays the external clock signal (XCLK) under control of the delay controller (20) to generate a delayed clock signal (XDATA). The delayed clock signal (XDATA) is used as a reference signal for, e.g., synchronizing data output with the rising edge of the external clock signal (XCLK) (i.e., the DLL (100) serves to make the access time (tAC)=0).

The output of the DLL (100) (i.e., the delayed signal (XDATA) is fed back to the compensation delay unit (40), which generates a feedback signal (FBI). The phase detector (10) (or phase comparator) compares the phase of the external clock signal (XCLK) with the phase of the feedback signal (FBI) and generates a detection signal that corresponds to a detected phase difference between the external clock signal (XCLK) and the feedback signal (FBI). The detection signal is input to the delay controller (20), which then generates a control signal based on the detection signal to control the delay unit (30) to vary (increase or decrease) the amount of delay that is applied to the external clock signal (XCLK).

The conventional DLL (100) of FIG. 1A is configured such that the delay unit can only make relatively large coarse adjustments (e.g., several picoseconds). However, when finer delay adjustability is required for high-frequency operation, the DLL architecture of FIG. 1B may be implemented.

Figure 1B:
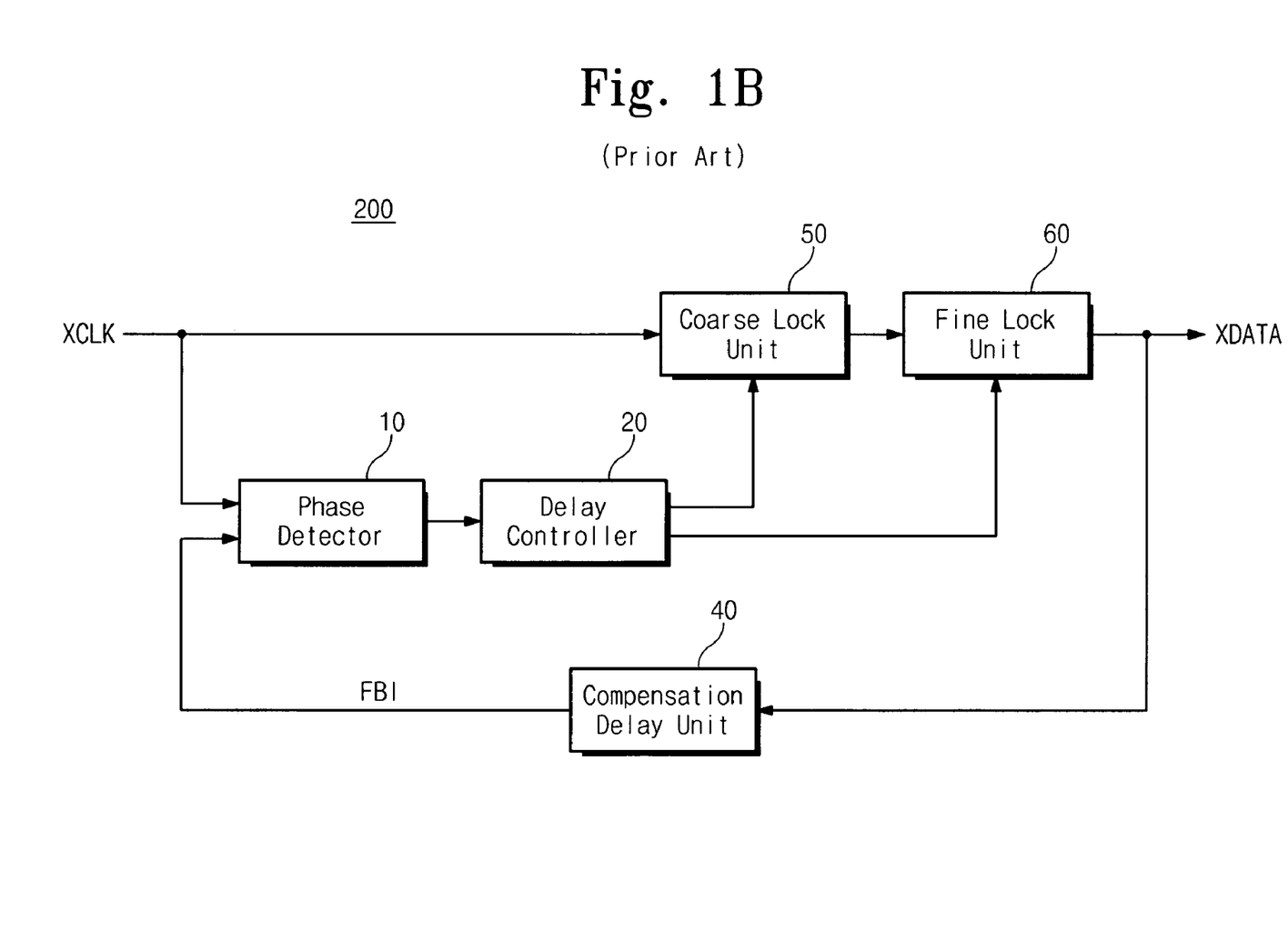
FIG. 1B schematically illustrates a conventional DLL circuit, which implements a coarse-lock/fine-lock scheme.

In particular, FIG. 1B schematically illustrates a conventional DLL circuit (200), which implements a coarse-lock/fine-lock scheme. Referring to FIG. 1B, the DLL (200) is similar to the DLL (100) of FIG. 1A in that the DLL (200) includes a phase detector (10), a delay controller (20) and a compensation delay unit (40). However, the DLL (200) comprises a coarse-lock delay unit (50) and a fine-lock delay unit (60). The phase detector (10) compares the external clock signal (XCLK) with the feedback signal (FBI) from the compensation delay unit (40) to generate detection (comparison) signals corresponding to detected phase differences between the external clock signal (XCLK) and the feedback signal (FBI). The delay controller (20) receives the detection signals and generates either a first delay control signal or a second delay control signal.

The coarse-lock delay unit (50) is responsive to the first delay control signal to delay the external clock signal (XCLK) by a predetermined first phase delay. The fine-lock delay unit (60) is responsive to the second delay control signal to delay the external clock signal (XCLK) by a predetermined second phase delay (which is smaller than the first phase delay)). More specifically, the coarse-lock delay unit (50) provides phase delay increments that are greater that the phase delay increments provided by the fine-lock delay unit (60). The coarse-lock delay unit (50) operates to coarsely adjust the delay of the external clock signal (XCLK) at a higher speed, and the fine-lock delay unit (60) operates to finely adjust the delay of the external clock signal (XCLK) to generate the delayed clock signal (XDATA). The output of the DLL (200), i.e., the delayed signal (XDATA), is fed back to the compensation delay unit (40) to generate the feedback signal (FBI).

Figure 2A:
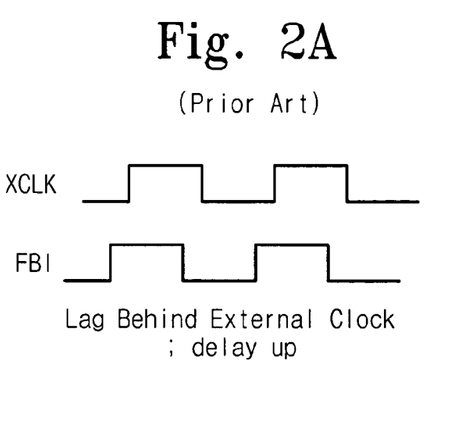
FIG. 2A is an exemplary timing diagram illustrating a condition in which the phase a feedback signal (FBI) lags behind the phase of the external clock signal (XCLK).
Figure 2B:
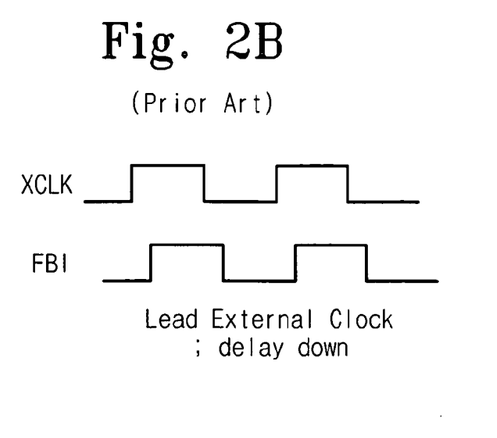
FIG. 2B is an exemplary timing diagram illustrating a condition in which the phase of a feedback signal (FBI) leads the phase of the external clock signal (XCLK).

FIG. 2A is an exemplary timing diagram illustrating a condition in which the phase the feedback signal (FBI) lags behind the phase of the external clock signal (XCLK) and FIG. 2B is an exemplary timing diagram illustrating a condition in which the phase of the feedback signal (FBI) leads the phase of the external clock signal (XCLK). With the condition depicted in FIG. 2A, the phase of the delayed output signal (XDATA) lags that of the external clock signal, and the delay controller (20) generates control signal to increase phase delay applied to the external clock signal (XCLK) to generate the output signal (XDATA). On the other hand, with the condition depicted in FIG. 2B, the phase of the delayed output signal (XDATA) leads that of the external clock signal, and the delay controller (20) generates a control signal to decrease the phase delay applied to the external clock signal (XCLK) to generate the output signal (XDATA).

In a delay locked loop (DLL) using a coarse-lock/fine-lock architecture such as depicted in FIG. 1B, a mechanism is provided for determining when to transition from the coarse-lock to the fine-lock delay. One method for determining when to transition from coarse-lock to fine-lock is detecting a condition in which the phase of the feedback signal (FBI) is initially detected (at one point in time) to lag behind the phase of the external clock signal (XCLK) and then the phase of the feedback signal (FBI) is subsequently detected (at the next point in time) to lead the phase of the external clock signal (XCLK). When this condition occurs, the coarse-lock transitions to the fine-lock delay.

Figure 3A:
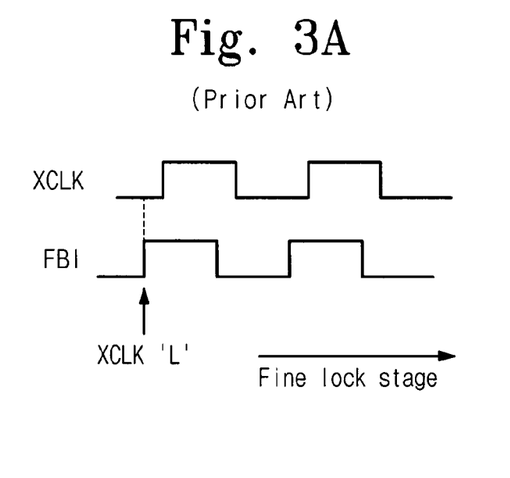
FIGS. 3A and 3B are exemplary timing diagrams that illustrate a conventional method for determining when to transition from a coarse-lock to a fine-lock in the conventional DLL circuit of FIG. 1B.
Figure 3B:
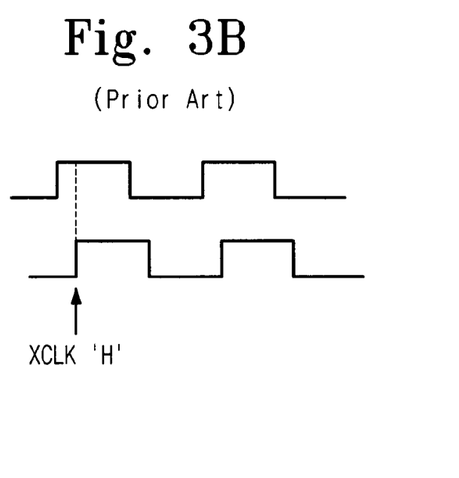

For example, the exemplary timing diagrams of FIGS. 3A and 3B illustrate a method for determining when to transition from a coarse-lock to a fine-lock in the conventional DLL circuit (200) of FIG. 1B. FIG. 3A illustrates an initial point in time in which the phase detector (10) compares the phase difference between the feedback signal (FBI) and the external clock signal (XCLK) by detecting the logic value of the external clock signal (XCLK) at a rising edge of the feedback signal (FBI). In FIG. 3A, the logic level of the external clock signal (XCLK) is determined to be logic low "L" at that time (i.e., the phase of the data output lags behinds a phase of the external clock signal (XCLK)). As with the method of FIG. 2A, the delay of the output signal (XDATA) will be increased.

FIG. 3B illustrates the next point in time in which the phase detector (10) compares the phase difference between the feedback signal (FBI) and the external clock signal (XCLK) by detecting the logic value of the external clock signal (XCLK) at a rising edge of the feedback signal (FBI). In FIG. 3B, the logic level of the external clock signal (XCLK) is determined to be logic low "H" at that time (i.e., the phase of the data output leads the phase of the external clock signal (XCLK)). When this condition (L→H) is detected for two successive detection times (i.e., the phase of the feedback signal (FBI) first lags and then leads the phase of the external clock signal (XCLK)), the DDL transitions from the coarse-lock control to the fine-lock control.

Figure 4:
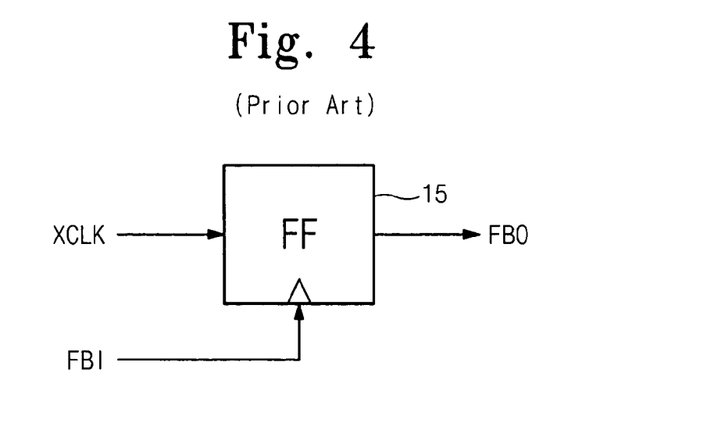
FIG. 4 is a block diagram illustrating a conventional embodiment of a phase detector.

FIG. 4 is a block diagram illustrating a conventional embodiment of the phase detector (10), which comprises a comparator (15) which receives as input the feedback signal (FBI) and the external clock signal (XCLK) and outputs as a detection signal (FBO) the logic level of the external clock signal (XCLK) at the rising edge of the feedback signal (FBI).

Figure 5:
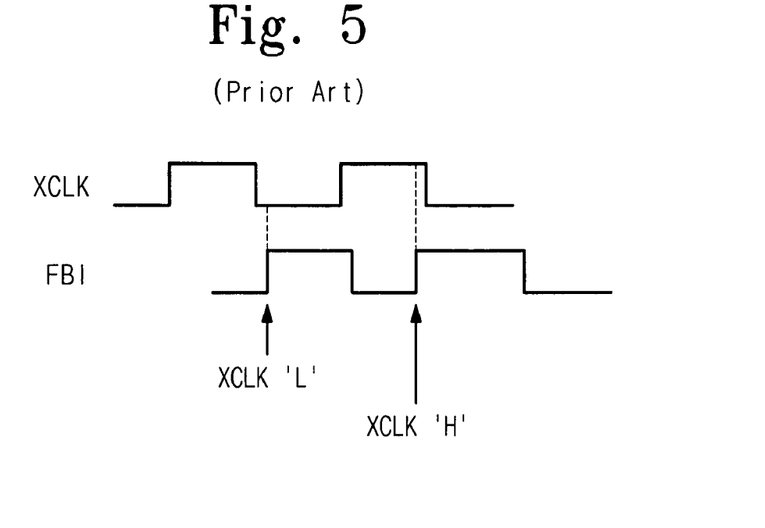
FIG. 5 is an exemplary timing diagram to illustrate a condition in which the phase detector of FIG. 4 in the conventional DLL of FIG. 1B can malfunction by incorrectly transitioning from a coarse-lock delay unit to the fine-lock delay unit due to the occurrence of jitter or noise.

FIG. 5 is an exemplary timing diagram to illustrate a condition in which the phase detector (10) in the conventional DLL (200) can malfunction by incorrectly transitioning from a coarse-lock delay unit to the fine-lock delay unit due to the occurrence of jitter or noise. As depicted in the exemplary timing diagram of FIG. 5, a situation may occur whereby the feedback signal (FBI) is compared to the external clock signal (XCLK) in the phase detector (10) at a first time when the rising edge of the feedback signal (FBI) is positioned on a low level around the falling edge of the external clock signal (XCLK) (detection signal (FBO) is logic low "L") and then at a next time goes to a high level, just after being compared with the external clock signal, due to a jittering of the external clock signal. In this case, the external clock signal should be transmitted to the fine-lock unit with, e.g., a half clock delay by the coarse-lock unit, but due to the jitter, the external clock signal is applied to the fine-lock unit without the half clock delay. As a result, there is a malfunction. Since the jitter of the external clock signal is typically ±5%, the noise immunity of the conventional DLL suffering from such a malfunction is considerably weakened.

SUMMARY OF THE INVENTION

Exemplary embodiments of the invention include delay locked loop (DLL) circuits and methods, which prevent erroneous transitions from a coarse-lock delay unit to a fine-lock delay unit due to jitter or noise. More specifically, exemplary embodiments of the invention include phase detector circuits and methods in which an external clock signal is compared with two feedback signals, to thereby increase the immunity of the phase detector to noise or jitter and enables a more precise method for detecting when to transition from a coarse-lock to a fine-lock.

More specifically, in one exemplary embodiment, a delay locked loop (DLL) circuit comprises: a phase detector comprising a first detector that compares an external clock signal with a first feedback signal to generate a first detection signal corresponding to a phase difference between the external clock signal and the feedback signal, and a second detector that compares the external clock signal with a second feedback signal to generate a second detection signal corresponding to a phase difference between the external clock signal and the second feedback signal; a delay controller that generates a first delay control signal or a second delay control signal, based on the first and second detection signals output from the phase detector; a coarse-lock unit that delays the external clock signal by a first phase delay in response to the first delay control signal; and a fine-lock unit that delays the external clock signal by a second phase delay, which is smaller than the first phase delay, in response to the second delay control signal. The DLL may e implemented, for example, in a semiconductor integrated circuit memory device to synchronize a data access operation with the external clock signal.

In another exemplary embodiment, the phase detector comprises a delay unit that receives as input the first feedback signal and delays the first feedback signal to generate the second feedback signal as a delayed version of the first feedback signal. The first feedback signal is a signal that is synchronized with the external clock signal by the DLL.

In yet another exemplary embodiment, the phase delay unit of the phase detector regulates an amount of phase delay between the first and second feedback signals based on frequency information that is acquired during operation of the DLL. The frequency information is used to set the amount of phase delay between the first and second feedback signals over a frequency bandwidth of operation.

In one exemplary embodiment of the invention, the frequency information may be a CAS latency value or a number of selected delay cells of the DLL, or both the CAS latency value and the number of selected delay cells. The frequency information may be a metric that is acquired using a frequency detector.

In another exemplary embodiment of the invention, the DLL transitions from a coarse-lock delay to fine-lock delay when a rising edge of the external clock signal is detected to occur within a phase window defined by rising edges of the first and second feedback signals.

These and other exemplary embodiments, aspects, features and advantages of the invention will be described and become apparent from the following detailed description of preferred embodiments, which is to be read in connection with the accompanying drawings.

DETAILED DESCRIPTION OF EXEMPLARY EMBODIMENTS

Exemplary embodiments of the invention include delay locked loop (DLL) circuits and methods, which prevent erroneous transitions from a coarse-lock delay unit to a fine-lock delay unit due to jitter or noise. More specifically, exemplary embodiments of the invention include phase detector circuits and methods in which an external clock signal is compared with two feedback signals, to thereby increase the immunity of the phase detector to noise or jitter and enables a more precise method for detecting when to transition from a coarse-lock to a fine-lock.

Figure 6:
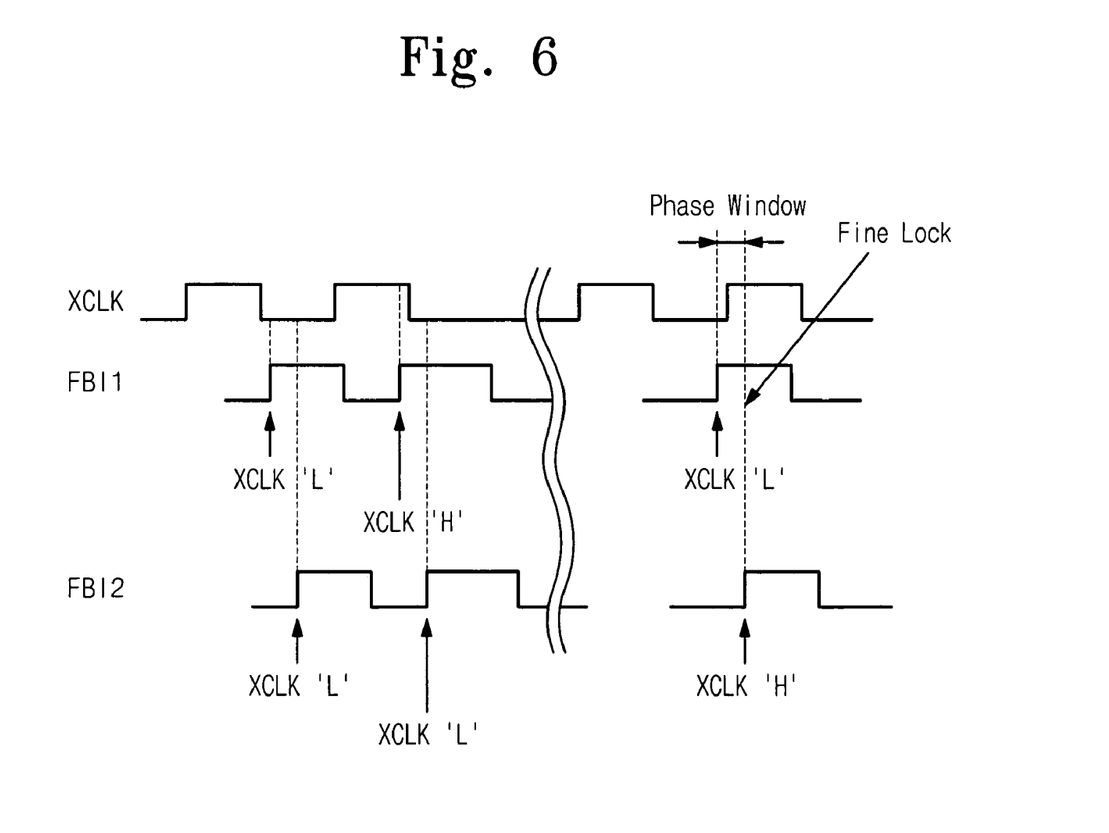
FIG. 6 is a timing diagram illustrating a phase detection method according to an exemplary embodiment of the invention, which uses a plurality of feedback signals for detecting the phase of an external clock signal.

FIG. 6 is a timing diagram illustrating a phase detection method according to an exemplary embodiment of the invention, which uses a plurality of feedback signals for detecting the phase of an external clock signal (XCLK). More specifically, as depicted in the exemplary embodiment of FIG. 6, a phase detection method implements a first feedback signal FBI1 and a second feedback signal FBI2, wherein the first feedback signal FBI1 is a signal to be synchronized with the external clock signal (XCLK) through a delay locked loop (DLL), and the second feedback signal FBI2 is a delayed version of the first feedback signal FBI1.

In general, a phase detection method comprises detecting the logic state of the external clock signal (XCLK) at the rising edges of the first and second feedback signals, FBI1 and FBI2, to determine when to transition from the coarse-lock to the fine-lock delay. As depicted in FIG. 6, the rising edges of the two feedback signals, FBI1 and FBI2, define boundaries of a "phase window", which is used for determining the detection results in a manner that improves the noise immunity of the phase detection process. The "phase window" represents the phase offset between the first and second feedback signals.

In one exemplary embodiment of the invention, when a rising edge of the external clock signal (XCLK) is determined to occur in the phase window, a transition from a coarse-lock to a fine-lock can be triggered. More specifically, as depicted in FIG. 6, when the logic level of the external clock signal (XCLK) detected by the first feedback signal FBI1 is logic low "L" and the logic level of the external clock signal (XCLK) detected by the second feedback signal FBI2 is logic high "H" (i.e., detection result is LH), this result can be condition that triggers the delay controller (20) to transition from the coarse-lock to the fine-lock.

Ideally, during operation of the DLL, to transition from coarse to fine lock, the detection results of detecting the external clock signal (XCLK) by the first and second feedback signals, FBI1 and FBI2, should change in the following pattern: LL→LH→HH. However, depending on the delay value (size of phase window), this ideal condition may not occur, and the detection results may be determined as: LL→HH, without detecting the condition LH. Therefore, to prevent such a malfunction, a transition from the coarse-lock to the fine-lock can be triggered at when the detection results are HH. More specifically, transition from the coarse-lock to the fine-lock can be triggered when the detection results of the first and second feedback signals are determined as HH. However, this also suffers from the malfunction that the coarse-lock is not maintained and transitions to the fine-lock even when the pattern HL→HH is detected. Therefore, it is preferable to transition from the coarse-lock to the fine lock when the pattern HL→HH is detected, but not LL→HH.

Typically, an acceptable level of jitter of the external clock signal (XCLK) is ±5%. The permissible level is determined as a percentage, not absolute time. The value of the jitter will vary with clock frequency. For example, if the permissible level of jitter is 5% under a frequency of 333 MHz (tCC=3 ns), then a clock rise or fall is ±150 ps. If the permissible level of jitter is 5% under a frequency of 100 MHz (tCC=10 ns), then a clock rise or fall is ±500 ps.

With an exemplary phase detection method using two feedback signals, the noise immunity is determined by the size of the "phase window". A malfunction can occur if the jitter of the external clock signal (XCLK) is larger than the phase window of the phase detector as defined by the delay between the first and second feedback signals. Therefore, it is preferable to set the phase window of the phase detector wide enough to tolerate jitter even in the lowest frequency.

Figure 7:
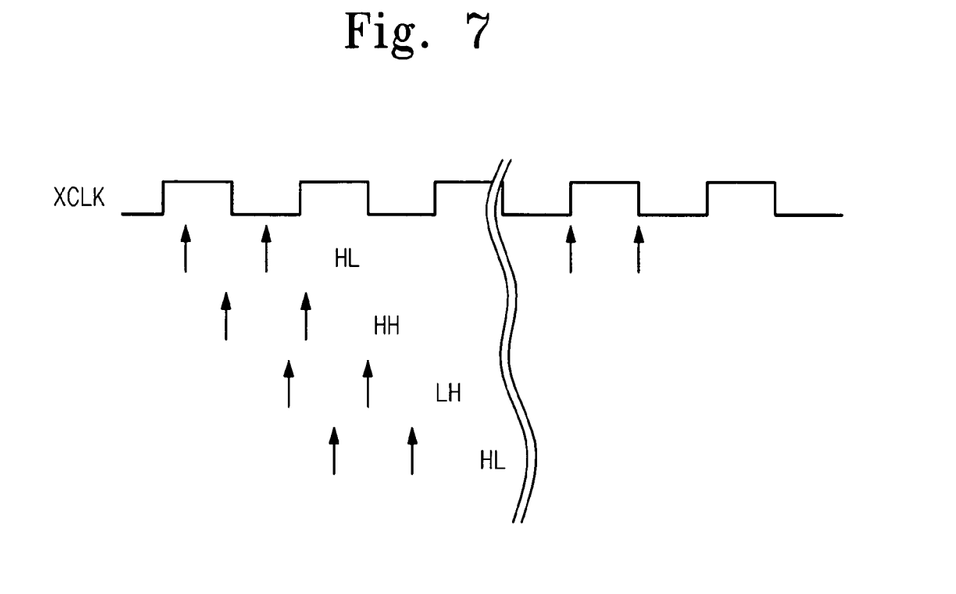
FIG. 7 is an exemplary timing diagram illustrating detection results that are acquired by measuring a value of an external clock signal at rising edges of two feedback signals in a phase detector according to an exemplary embodiment of the invention.

On the other hand, if the phase window of the phase detector is set to be very wide, high frequency operation of the semiconductor memory can cause a malfunction. This will be explained with reference to FIG. 7, which is a timing diagram showing the detection results that are acquired by measuring a value of an external clock signal at rising edges of two feedback signals. For instance, If the phase window of the phase detector is wide and the operation frequency is high, as shown in FIG. 7, the detection results may follow the pattern: HL→HH→LH, but not HL→LL→LH. Thus, in the case where a transition from the coarse-lock to the fine-lock is triggered only when the pattern of the detection results is HL→LL→LH or HH, the transition to the fine-lock may not occur.

Therefore, since an absolute value of a timing error for the same percent jitter is small at a high frequency, it is preferable to reduce the size of the phase window for normal operation at the high frequency. That is, for a normal fine-lock determining operation, it is preferable to increase the size of the phase window to improve the noise immunity for jitter at a low frequency operation while reducing the size of the phase window for a high frequency operation. Therefore, in accordance with exemplary embodiments of the invention, phase detection circuits and methods are provided, which allow the size of the phase window to be adapted/regulated based on frequency information (e.g. column address strobe (CAS) latency information and/or the number of delay cells) to determine an optimal phase window size, to thereby allow proper operation over a desired frequency bandwidth.

Figure 8:
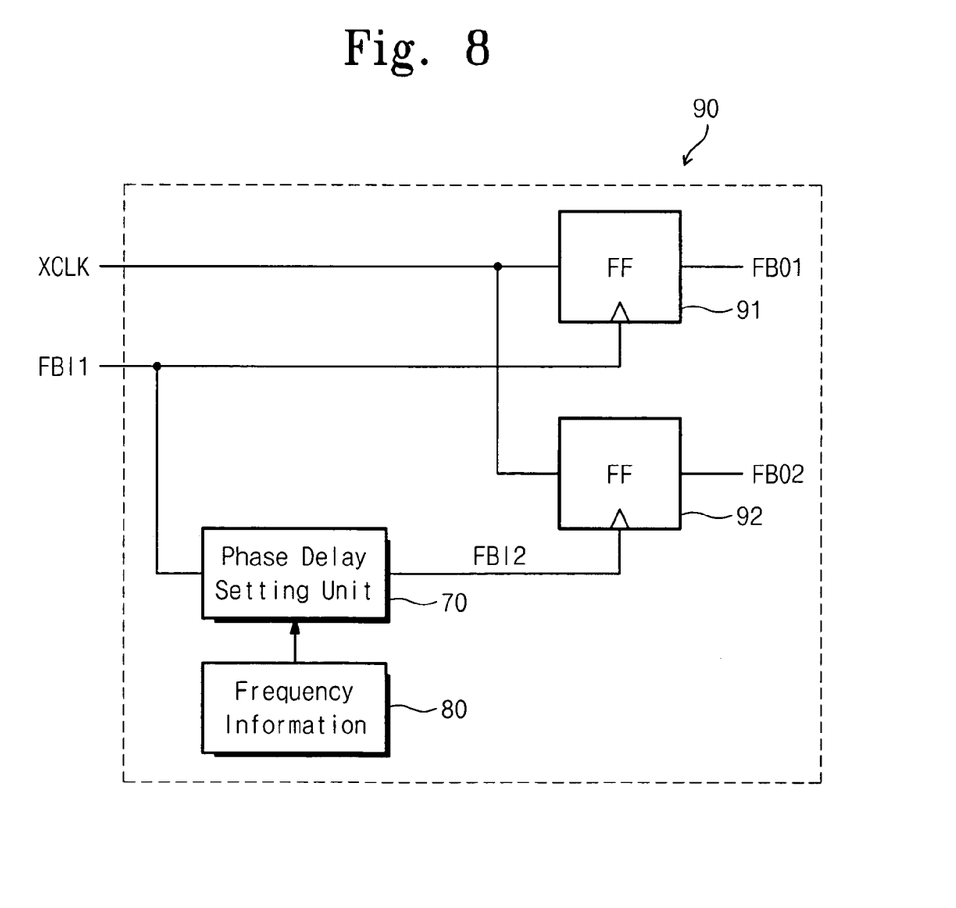
FIG. 8 schematically illustrates a phase detector according to another exemplary embodiment of the invention, which includes mechanisms to regulate the size of a phase window by using frequency information.

By way of example, FIG. 8 illustrates a phase detector according to an exemplary embodiment of the invention, which implements a plurality of feedback signals for phase detection and which includes a mechanism for regulating the size of a phase window by using frequency information. More specifically, FIG. 8 depicts a phase detector (90) according to an exemplary embodiment of the invention, which can be implemented in place of the phase detector (10) in the DLL circuit (200) of FIG. 2. The phase detector (90) receives as input the external clock signal (XCLK) and the feedback signal (FBI1), and compares (91) the external clock signal (XCLK) with the first feedback signal (FBI1) to generate a comparison signal (FBO1), and compares (92) the external clock signal (XCLK) with a second feedback signal (FBI2), which is a delayed version of the first feedback signal, to generate a second comparison signal (FBO2). Advantageously, as noted above, the use of two feedback signals enables a more precise determination as to the time to transition from the coarse lock to the fine lock, as compared to using one feedback signal as shown in FIG. 5 which can result in improper transition from coarse to fine lock due to jitter or noise.

The phase detector (90) comprises a phase delay setting unit (70) which determines the amount of phase delay to apply to the first feedback signal (FBI1) to generate the second feedback signal (FBI2) using frequency information (80). In one exemplary embodiment, CAS latency, the number of delay cells or an output of a frequency detection circuit can be used to acquire the frequency information used to determine the phase delay to be applied to the first feedback signal FBI1 to generate the second feedback signal FBI2.

More specifically, the CAS latency is sufficient to use for frequency information since as the frequency increases, the CAS latency increases. For example, since the operation frequency operation can be determined to be high if the CAS latency is 4 or 5, the CAS latency value may be used to determination a phase window that is sufficient for operation between some high and low frequency. Moreover, in a delay locked loop using delay cells, a large number of delay cells are selected to provide synchronization at a low frequency, but a smaller number of delay cells are selected to provide synchronization at a high frequency. Therefore, the number of delay cells can be used as frequency information that is used as a standard for determining a high frequency and a low frequency to select a sufficient phase window.

The CAS latency and information regarding the amount of selected delay cells can be used alone, or in combination, as frequency information to determine the size of the phase window of the phase detector. Moreover, other relevant frequency information that can be detected through a frequency detection circuit or method may be metrics of frequency information for setting the phase window.

Although exemplary embodiments have been described herein with reference to the accompanying drawings, it is to be understood that the present invention is not limited to those precise embodiments, and that various other changes and modifications may be affected therein by one skilled in the art without departing from the scope and spirit of the invention.

What is claimed is:

1. A delay locked loop (DLL) circuit, comprising:
    a phase detector comprising a first detector that compares an external clock signal with a first feedback signal to generate a first detection signal corresponding to a phase difference between the external clock signal and the first feedback signal, and a second detector that compares the external clock signal with a second feedback signal to generate a second detection signal corresponding to a phase difference between the external clock signal and the second feedback signal, wherein the phase detector further comprises a delay unit that receives as input the first feedback signal and delays the first feedback signal to generate the second feedback signal as a delayed version of the first feedback signal;
    a delay controller that generates a first delay control signal or a second delay control signal, based on the first and second detection signals output from the phase detector;
    a coarse-lock unit that delays the external clock signal by a first phase delay in response to the first delay control signal; and
    a fine-lock unit that delays the external clock signal by a second phase delay, which is smaller than the first phase delay, in response to the second delay control signal.

2. The circuit of claim 1, wherein the first and second feedback signals have the same frequency, but with a phase difference.

3. The circuit of claim 1, wherein the first feedback signal is a signal that is synchronized with the external clock signal by the DLL.

4. The circuit of claim 1, wherein the phase delay unit of the phase detector regulates an amount of phase delay between the first and second feedback signals based on frequency information that is acquired during operation of the DLL.

5. The circuit of claim 4, wherein the frequency information is used to set the amount of phase delay over a frequency bandwidth of operation.

6. The circuit of claim 4, wherein the frequency information comprises a CAS latency value or a number of selected delay cells of the DLL, or both the CAS latency value and the number of selected delay cells.

7. The circuit of claim 4, wherein the frequency information is a metric that is acquired using a frequency detector.

8. The circuit of claim 1, wherein the DLL is implemented in a semiconductor integrated circuit memory device to synchronize a data access operation with the external clock signal.

9. A delay locked loop (DLL) circuit, comprising:
    a phase detector comprising a first detector that compares an external clock signal with a first feedback signal to generate a first detection signal corresponding to a phase difference between the external clock signal and the first feedback signal, and a second detector that compares the external clock signal with a second feedback signal to generate a second detection signal corresponding to a phase difference between the external clock signal and the second feedback signal;

a delay controller that generates a first delay control signal or a second delay control signal, based on the first and second detection signals output from the phase detector;

a coarse-lock unit that delays the external clock signal by a first phase delay in response to the first delay control signal; and a fine-lock unit that delays the external clock signal by a second phase delay, which is smaller than the first phase delay, in response to the second delay control signal, wherein DLL transitions from a coarse-lock delay to fine-lock delay when a rising edge of the external clock signal is detected to occur within a phase window defined by rising edges of the first and second feedback signals.

10. A method for providing clock synchronization for a semiconductor integrated circuit device, comprising the steps of:

comparing an external clock signal with a first feedback signal and a second feedback signal to generate a first detection signal corresponding to a phase difference between the external clock signal and the first feedback signal and a second detection signal corresponding to a phase difference between the external clock signal and the second feedback signal, respectively, wherein the second feedback signal is generated by delaying the first feedback signal to generate the second feedback signal as a delayed version of the first feedback signal;

generating a first delay control signal or a second delay control signal, based on the first and second detection signals; and delaying the external clock signal by a first phase delay in response to the first delay control signal or delaying the external clock signal by a second phase delay, which is smaller than the first phase delay, in response to the second delay control signal.

11. The method of claim 10, wherein the first and second feedback signals have the same frequency, but with a phase difference.

12. The method of claim 10, comprising synchronizing the first feedback signal with the external clock signal.

13. The method of claim 10, regulating an amount of phase delay between the first and second feedback signals based on frequency information that is acquired during operation of the semiconductor integrated circuit.

14. The method of claim 13, setting the amount of phase delay over a frequency bandwidth of operation based on the frequency information.

15. The method of claim 13, wherein the frequency information comprises a CAS latency value or a number of selected delay cells of the DLL, or both the CAS latency value and the number of selected delay cells.

16. The method of claim 13, comprising acquiring the frequency information using a frequency detector.

17. The method of claim 10, wherein the semiconductor integrated circuit comprises a semiconductor integrated circuit memory device, and wherein the method is used to synchronize a data access operation with the external clock signal.

18. A method for providing clock synchronization for a semiconductor integrated circuit device, comprising the steps of:

comparing an external clock signal with a first feedback signal and a second feedback signal to generate a first detection signal corresponding to a phase difference between the external clock signal and the first feedback signal and a second detection signal corresponding to a phase difference between the external clock signal and the second feedback signal, respectively;

generating a first delay control signal or a second delay control signal, based on the first and second detection signals;

delaying the external clock signal by a first phase delay in response to the first delay control signal or delaying the external clock signal by a second phase delay, which is smaller than the first phase delay, in response to the second delay control signal; and transitioning from a coarse-lock delay to a fine-lock delay when a rising edge of the external clock signal is detected to occur within a phase window defined by rising edges of the first and second feedback signals.

* * * * *